(12) United States Patent
Kushida

(10) Patent No.: US 7,573,118 B2
(45) Date of Patent: Aug. 11, 2009

(54) MOS ELECTRIC FUSE, ITS PROGRAMMING METHOD, AND SEMICONDUCTOR DEVICE USING THE SAME

(75) Inventor: Keiichi Kushida, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 8 days.

(21) Appl. No.: 11/776,839

(22) Filed: Jul. 12, 2007

(65) Prior Publication Data

US 2007/0258311 A1 Nov. 8, 2007

Related U.S. Application Data

(62) Division of application No. 10/973,412, filed on Oct. 27, 2004, now abandoned.

(30) Foreign Application Priority Data

Aug. 18, 2004 (JP) ............................. 2004-238537

(51) Int. Cl.
*H01L 29/72* (2006.01)
(52) U.S. Cl. ........................ 257/529; 257/534; 365/96
(58) Field of Classification Search ................. 257/529, 257/534; 365/96
See application file for complete search history.

(56) References Cited

U.S. PATENT DOCUMENTS 5,258,947 A * 11/1993 Sourgen ...................... 365/96
6,400,632 B1  6/2002 Tanizaki et al.
6,580,144 B2  6/2003 Anthony
6,611,040 B2 * 8/2003 Gelsomini et al. ........... 257/530
2002/0051399 A1 * 5/2002 Tanizaki et al. ........... 365/225.7

FOREIGN PATENT DOCUMENTS

| JP | 7-176703 | 7/1995 |
| JP | 2000-123592 | 4/2000 |
| WO | WO 03/025944 A1 | 3/2003 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A programming method of a MOS electric fuse including preparing, as a fuse element, a MOS transistor which has a first impurity region and a second impurity region, both of a second conductivity type, formed to face with each other on an upper surface of a well of a first conductivity type on a semiconductor substrate, a gate dielectric film formed on the upper surface of the well at least between the first impurity region and the second impurity region, and a gate electrode formed through the gate dielectric film on the upper surface of the well held between the first impurity region and the second impurity region, and applying a first voltage to the gate electrode, and a second voltage different from the first voltage to the first impurity region, and short-circuiting the gate dielectric film only between the gate electrode and the first impurity region.

17 Claims, 4 Drawing Sheets

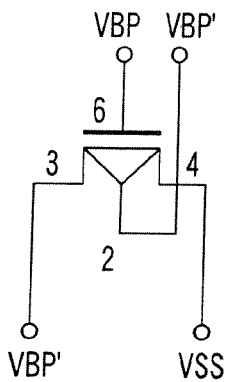 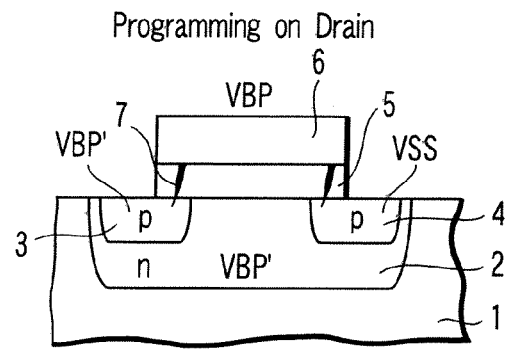
FIG. 8A  FIG. 8B
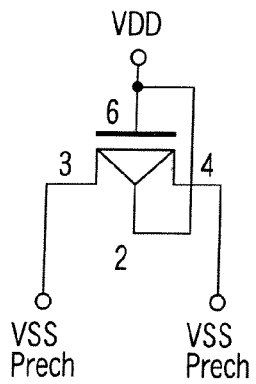 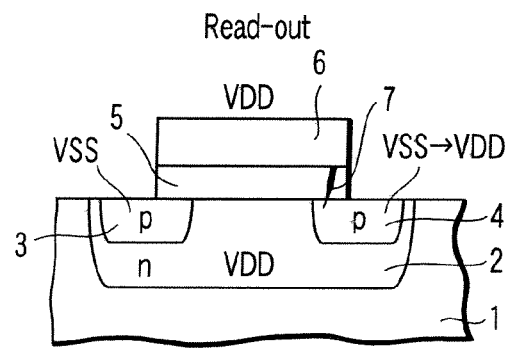
FIG. 9A  FIG. 9B
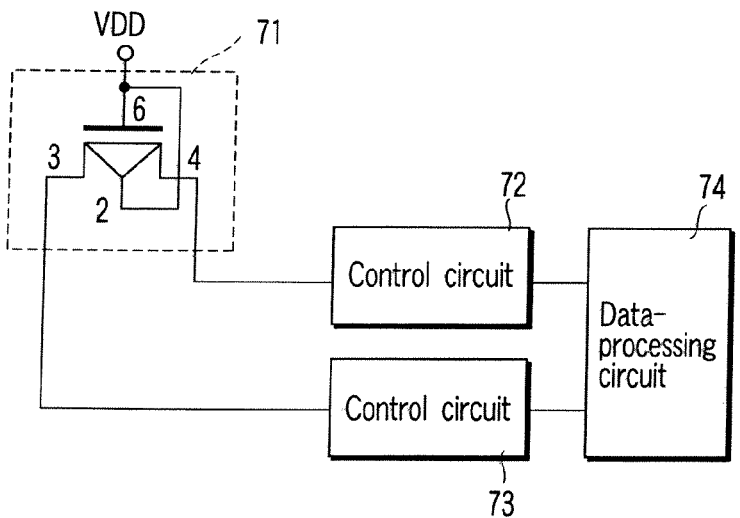
FIG. 10

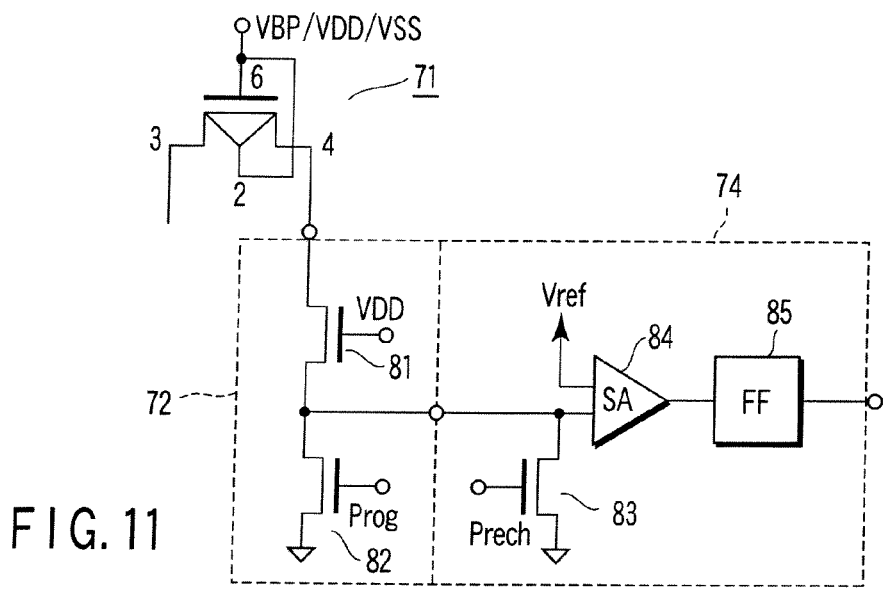
F I G. 11
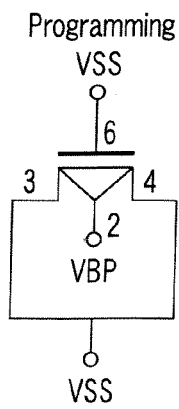
F I G. 12A
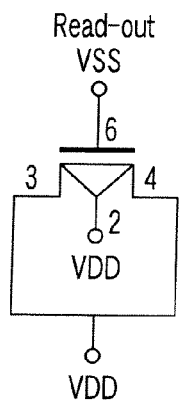
F I G. 12B
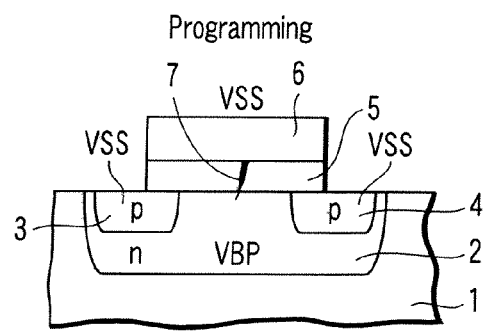
F I G. 12C

MOS ELECTRIC FUSE, ITS PROGRAMMING METHOD, AND SEMICONDUCTOR DEVICE USING THE SAME

CROSS-REFERENCE TO RELATED APPLICATIONS

This application is a divisional of application Ser. No. 10/973,412, filed Oct. 27, 2004 and claims the benefit of priority from prior Japanese Patent Application No. 2004-238537, filed Aug. 18, 2004. The entire contents of which are incorporated herein by reference.

BACKGROUND OF THE INVENTION

1. Field of the Invention

The present invention relates to an electric fuse, and more particularly to a MOS electric fuse which is configured to short-circuit a gate dielectric film and which is suitably applied to a MOS semiconductor device.

2. Description of the Related Art

There has conventionally been known a semiconductor memory enabling electric data writing (PROM) which uses a fuse element as a storage element. The semiconductor memory of such a type is classified into a fuse ROM which fuses the fuse element to store information, and a fuse ROM which stores information making an insulator to a conductor by dielectric breakdown (may be referred to as antifuse).

The fuse ROM that breaks down the insulator to store the information is disclosed in, for example, Jpn. Pat. Appln. KOKAI Publication. No. 7-176703. In this example, a fuse of a 3-layer structure that sandwiches a silicon layer by refractory metal layers is disposed on a semiconductor substrate, and the silicon layer is converted into a silicide compound of low resistance by supplying a large current to the fuse, and the refractory metal layers are short-circuited from each other.

Additionally, there has been known an electric fuse which electrically connects a source/drain of a MOS transistor to its substrate, applies a high voltage between the source/drain and a gate electrode to break down a gate dielectric film, and uses a resistance change therebetween. The breakdown of the fuse element to set a conductive state is called programming. For example, a gate of a PMOSFET is grounded, and a high program voltage is applied to the source, the drain and the substrate. In this case, a channel is formed in the PMOSFET. When the applied voltage becomes higher, a withstand limit of the gate dielectric film is exceeded to break down the insulator, thereby making the gate film conductive. In this way, the electric fuse is programmed.

In a large-capacity memory, a defective bit replacing technology that uses a redundancy circuit is indispensable. A fuse is used to store defective addresses. As a fuse of this type, there has been known a method which fuses a polysilicon wiring or a transistor.

The programming of the MOS transistor type fuse is classified into two cases, that is, a case in which dielectric breakdown of the gate dielectric film occurs on the source (drain) and a case in which dielectric breakdown occurs on the channel. Not only electric characteristics are different between the aforementioned two cases, but also resistance values between the terminals are different depending on a position of the broken down dielectric film. When such a variance occurs in fuse electric characteristics after the breakdown of the dielectric film, a voltage margin is reduced at the reading time of the fuse element to cause a reduction in yield or reliability.

Thus, there has been a demand to realize a MOS transistor type fuse which can make electric characteristics of an electric fuse uniform by keeping a breakdown mode thereof constant.

BRIEF SUMMARY OF THE INVENTION

According to a first aspect of the invention, there is provided a programming method of a MOS electric fuse which comprises:

preparing, as a fuse element, a MOS transistor which comprises a first impurity region and a second impurity region, both of a second conductivity type, formed to face with each other on an upper surface of a well of a first conductivity type on a semiconductor substrate, a gate dielectric film formed on the upper surface of the well at least between the first impurity region and the second impurity region, and a gate electrode formed through the gate dielectric film on the upper surface of the well held between the first impurity region and the second impurity region; and applying a first voltage to the gate electrode, and a second voltage different from the first voltage to the first impurity region, and short-circuiting the gate dielectric film only between the gate electrode and the first impurity region.

According to a second aspect of the invention, there is provided an electric fuse which comprises:

a semiconductor substrate;

a well of a first conductivity type formed on an upper surface of the semiconductor substrate;

a first impurity region and a second impurity region of a second conductivity type formed to face with each other on an upper surface of the well;

a gate dielectric film formed on the upper surface of the well at least between the first impurity region and the second impurity region; and a gate electrode formed through the gate dielectric film on the upper surface of the well between the first impurity region and the second impurity region, wherein substantially binary states of conduction and non-conduction are independently set between the first impurity region and the gate electrode and between the second impurity region and the gate electrode.

According to a third aspect of the invention, there is provided a semiconductor substrate which comprises:

a semiconductor substrate;

a plurality of wells of a first conductivity type formed on an upper surface of the semiconductor substrate; and a plurality of semiconductor structures formed in the plurality of wells, each of the plurality of semiconductor structures comprising a first impurity region and a second impurity region, both of a second conductivity type, formed to face with each other on an upper surface of each of the wells, a gate dielectric film formed on the upper surface of the well at least between the first impurity region and the second impurity region and having portions covering the first impurity region and the second impurity region, and a gate electrode formed through the gate dielectric film on the upper surface of the well held between the first impurity region and the second impurity region and having places opposed to the first impurity region and the second impurity region, wherein, regarding a first opposed place of the first impurity region and the gate electrode, and a second opposed place of the second impurity region and the gate electrode, there are a first state in which the first opposed place and the second opposed place are both in insulated states, a second state in which the first opposed place only is substantially short-circuited, a third state in which the second opposed place only is substantially short-circuited, and each of the plurality of semiconductor structures belongs to one of the first state to the third state.

BRIEF DESCRIPTION OF THE SEVERAL VIEWS OF THE DRAWING

FIGS. 8A and 8B are a connection diagram and a sectional view during drain programming of the electric fuse according to the second embodiment;

FIGS. 9A and 9B are a connection diagram and a sectional view during reading of the electric fuse according to the second embodiment;

FIG. 10 is a block diagram of an application circuit of the electric fuse according to the second embodiment;

FIG. 11 is a circuit diagram showing a specific example of the application circuit of FIG. 10;

FIGS. 12A to 12C are connection diagrams for programming and reading, and a sectional view during programming of an electric fuse according to a third embodiment.

DETAILED DESCRIPTION OF THE INVENTION

Figure 1A:
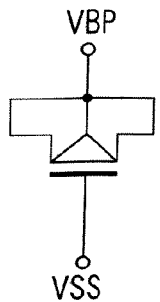
FIGS. 1A and 1B are a connection diagram and a sectional view of a conventional MOS electric fuse.
Figure 1B:
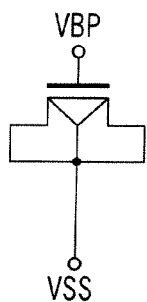

Before explanation of the embodiments of the present invention, problems of a conventional MOS electric fuse will specifically be described. For the MOS electric fuse, two configurations similar to those shown in FIGS. 1A and 1B are conceivable. The fuse of FIG. 1A is referred to as an inversion type which connects a source/drain/substrate of a PMOS to a program voltage (VBP) terminal, and a gate electrode to a ground (VSS). The fuse of FIG. 1B is referred to as an accumulation type, in which connections to a VBP terminal and a VSS terminal are reverse to those of FIG. 1A.

For example, as shown in FIG. 1A, the gate electrode of the PMOS is grounded, and a high program voltage VBP is applied to the source, the drain and the substrate. At this time, a channel is formed between the source and the drain of the PMOS. When the program voltage VBP become much higher, a withstand limit of a gate dielectric film is exceeded to break down a dielectric film, and a conductive state is set between the gate and the drain/source. In this way, the electric fuse is programmed.

Figure 2:
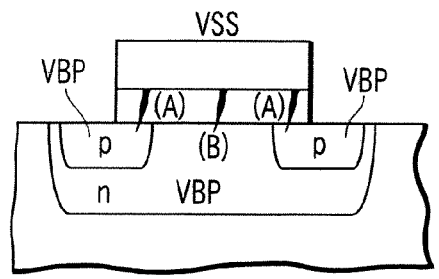
FIG. 2 is a schematic sectional view illustrating a problem of the conventional MOS electric fuse.
Figure 3:
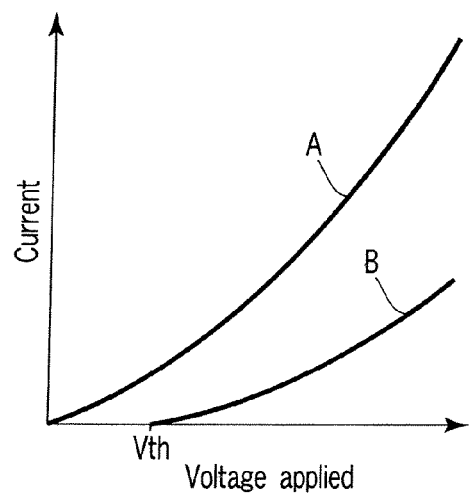
FIG. 3 is a characteristic view illustrating a cause of a variance in electric characteristics of the conventional MOS electric fuse.

In the aforementioned programming method, as shown in FIG. 2, breakdown places are classified into two cases: a case of breakdown on the source (or drain) (path A in FIG. 2), and a case of breakdown of the dielectric film on the channel (path B in FIG. 2). Electric characteristics are different between the two cases because positions of conductive points are different. That is, in the former case, the gate electrode and the source (or drain) are directly connected to each other through a breakdown portion in the case of the breakdown on the source or the drain, and in the latter case, resistance values of a dielectric film horizontal direction are different depending on positions of the broken down dielectric films in the case of the breakdown on the channel, and current values supplied between the VPP and VSS terminals are different as shown in FIG. 3. In such a conventional MOS electric fuse, a variance occurs in electric characteristics of the fuse after the dielectric film breakdown. Consequently, a voltage margin is deteriorated during reading of a fuse element to reduce yield or reliability.

According to the embodiments described below, a configuration of a MOS electric fuse, a programming method, and the like are provided to solve the afore-mentioned problems. That is, a gate dielectric film breakdown mode of the MOS electric fuse is limited to breakdown between a gate and a source (or drain), or breakdown substantially on a center between the soured and the drain, and electric characteristics of the electric fuse are made uniform. Additionally, since programs can be independently executed in the case of the breakdown between the gate and the source, between the gate and the drain, a dielectric film between the gate and the source or between the gate and the drain is selectively used to enable storage of information equivalent to the conventional two elements by one fuse element. Thus, a quaternary (4-value) or ternary (3-value) memory can be formed by one element.

Hereinafter, the embodiments will be described with reference to the accompanying drawings.

FIRST EMBODIMENT

Figure 4A:
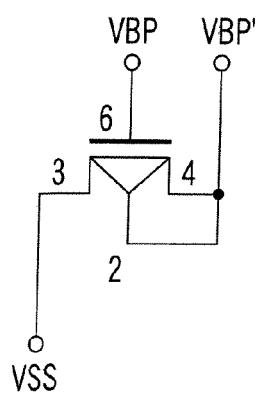
FIGS. 4A and 4B are a connection diagram and a sectional view during programming of an electric fuse (PMOS) according to a first embodiment.
Figure 4B:
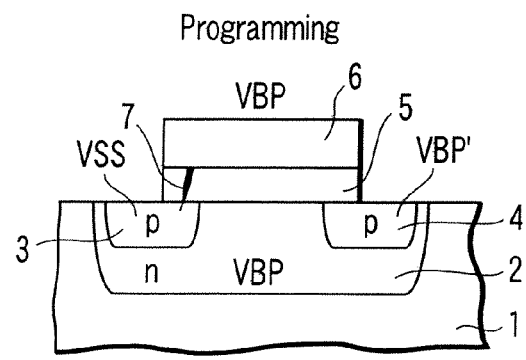

FIG. 4A is a connection view of a PMOS electric fuse according to a first embodiment, and FIG. 4B is a sectional view of the electric fuse schematically showing a voltage applied state during programming.

As shown in FIG. 4B, in an n-type well 2 formed in a semiconductor substrate 1, a source region (p-type impurity region) 3 and a drain region (p-type impurity region) 4 are formed to face with each other. A gate electrode 6 is formed through a gate dielectric film 5 on an upper surface of a portion of the well 2 sandwiched between the source region 3 and the drain region 4. A material, dimensions and the like of the MOS structure can be similar to those of a MOS structure of a MOS device on which a fused is mounted, for example, by a 90-nm process. No special materials or dimensions need be employed for the electric fuse.

A program voltage VBP (positive potential) is connected to the gate electrode 6, an optional voltage VBP' (a positive potential, e.g., a power supply voltage VDD) are connected to the drain region 4, the well 2, and the source region 3 is grounded (connected to VSS). However, the voltage should form no channel between the source and the drain. According to the embodiment, VBP'=VBP is established.

In this state, when a VBP voltage is sufficiently high, a withstand limit of the gate dielectric film 5 is exceeded to cause breakdown. In this case, a high voltage is only applied between the gate electrode 6 and the source region 3, and the gate dielectric film 5 of this portion is broken down. In other words, the aforementioned connection enables breakdown of the gate dielectric film only between the gage electrode 6 and the source region 3. Additionally, since the source region 3 and the drain region 4 are completely symmetrical to each other, needless to say, these portions are replaced by each other to make a connection and to enable programming.

In the foregoing, a similar program voltage VBP is applied to all of the gate electrode 6, the drain region 4, and the well 2. However, the voltage VBP' applied to the drain region 6, the well 2 is not necessarily the program voltage VBP, but the voltage may be power supply voltage VDD. Additionally, the voltage applied to the drain region 6, and the well region 2 may be different. For example, a voltage applied to the gate electrode 6 can be 2 to 5 V, and a voltage applied to the source region 3 (or drain region 4) or the well can be 0 to 3 V. In the case of programming in the described manner, the gate dielectric film is short-circuited to lower resistance.

However, a conductive/nonconductive ratio larger by 1000 times than a current ratio can be obtained.

Figure 5A:
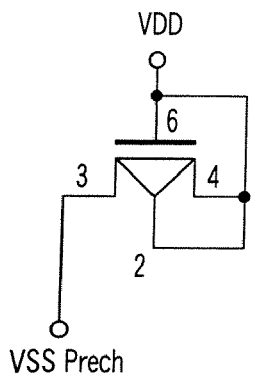
FIGS. 5A and 5B are a connection diagram and a sectional view during reading of the electric fuse according to the first embodiment.
Figure 5B:
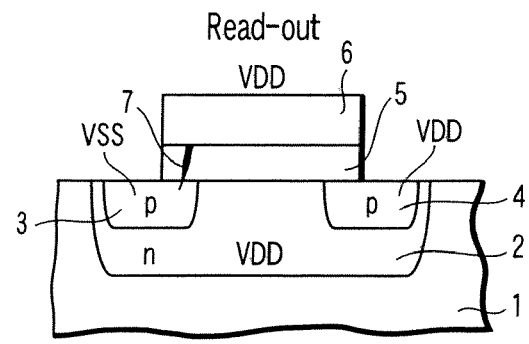

Each of FIGS. 5A and 5B shows an example of a reading operation. The source region 3, the drain region 4, and the gate electrode 6 are precharged once to VSS, and subsequently a normal power supply voltage VDD is applied to the gate electrode 6 after the source region 3 and the drain region 4 are set in floating states. At this time, a voltage of a programmed region (e.g., source region 3) is quickly set to VDD, while a nonprogrammed region (e.g., drain region 4) is maintained in the VSS state. This voltage difference is amplified by a sense amplifier, and fuse data is written into a flip-flop or the like. Accordingly, it is possible to read fuse information.

Figure 6A:
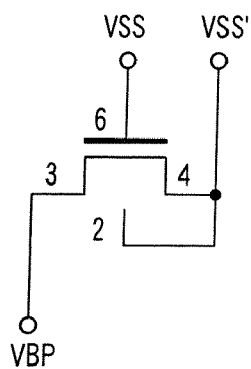
FIGS. 6A and 6B are a connection diagram and a sectional view when the electric fuse of the first embodiment comprises an NMOS.
Figure 6B:
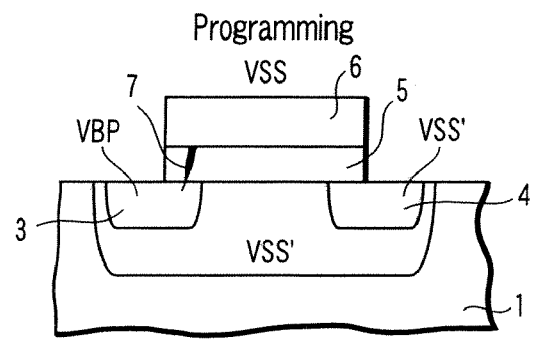

The embodiment has been described by taking the example of the PMOS type. However, the electric fuse can include an NMOS type by reversing a polarity. FIGS. 6A and 6B are a connection diagram and a sectional view when an NMOS is used. Similar portions are denoted by similar numerals, and duplicated explanation will be omitted. VSS' may be VSS (e.g., ground potential), or different from VSS. Additionally, voltages of the well 2 and the drain 4 may be different. VBP is a positive potential.

As described above, according to the first embodiment, since the gate dielectric film breakdown mode of the MOS electric fuse is limited to the breakdown between the gate and the source (or drain), it is possible to make electric characteristics of the electric fuse uniform.

In the aforementioned programming operation, the high voltage is applied between the source and the gate to execute the programming. However, programming can subsequently be executed between the drain and the gate. During the programming operation between the gate and the drain, whether the gate dielectric film between the gate and the source has been broken down or not has no influence at all on the breakdown operation between the gate and the drain.

Accordingly, the gate dielectric film between the gate and the source and the gate dielectric film between the gate and the drain can be independently broken down. Thus, it is possible to write quaternary (4-value) information in one fuse element. Such an example will be described in a second embodiment.

SECOND EMBODIMENT

Figure 7A:
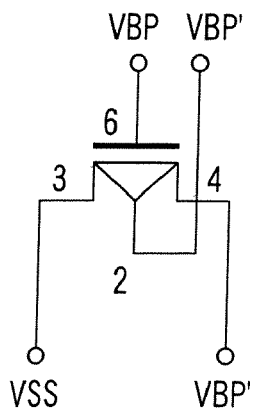
FIGS. 7A and 7B are a connection diagram and a sectional view during source programming of an electric fuse according to a second embodiment.
Figure 7B:
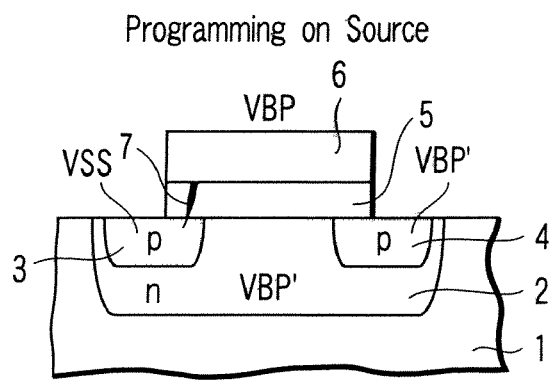

FIGS. 7A and 7B, and FIGS. 8A and 8B are schematic sectional views of an electric fuse illustrating a programming method of the MOS electric fuse according to a second embodiment. FIGS. 7A and 7B show voltage applied states when a gate dielectric film on a source region is broken down (during source programming) which are similar to those of the first embodiment of FIGS. 4A and 4B except for application of VBP' to a drain region. In this case, the VBP' may be equal to VBP, or VDD. Additionally, VBP' applied to a well 2 and VBP' applied to a drain region 4 may be different. However, the voltage should form no channel between the source and the drain. By such voltage application, a source side is programmed.

FIGS. 8A and 8B show voltage applied states when a drain side is programmed. The programming is similarly executed only by replacing the source and the drain by each other in FIGS. 7A and 7B. As a result of executing the programming of the drain side after the source side, dielectric film short-circuiting portions 7 are formed on both of the source and drain regions 3 and 4.

FIGS. 9A and 9B are views showing an example of a reading operation when the drain side alone is programmed. The source region 3, the drain region 4, and a gate electrode 6 are precharged to VSS. Subsequently, a normal power supply voltage VDD is applied to the gate electrode 6 after the source region 3 and the drain region 4 are set in floating states. At this time, a voltage of a programmed region (drain region 4) is quickly set to VDD, while a nonprogrammed region (source region 3) maintains a VSS state for a while. This voltage difference is amplified by a sense amplifier, and fuse data is written into a flip-flop or the like. Accordingly, it is possible to read fuse information.

Figure 13:
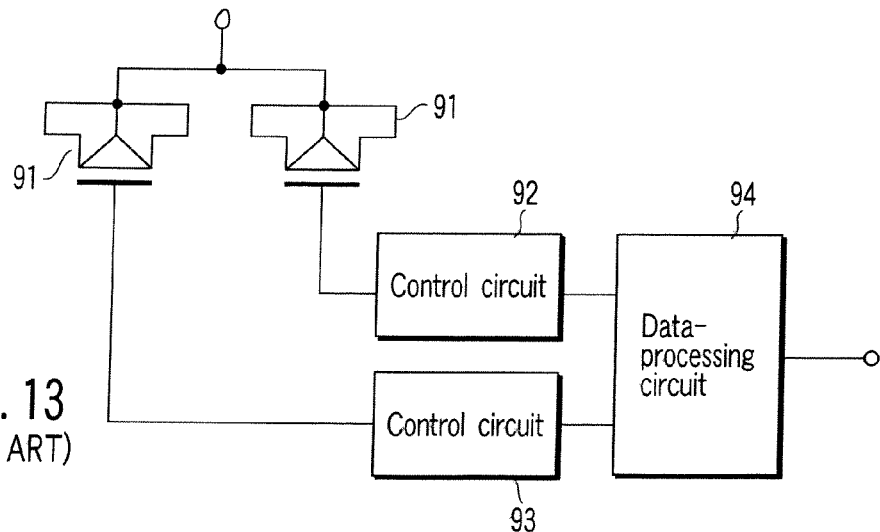
FIG. 13 is a block diagram showing an application circuit of a conventional MOS electric fuse.

FIG. 10 is a block diagram of a semiconductor device on which an electric fuse and a functional circuit are mounted. In an electric fuse element 71, the source region 3 and the drain region 4 are output terminals. The output terminals are connected to a data processing circuit 74, which includes a sense amplifier, a flip-flop for storing electric fuse data, or the like, through control circuits 72 and 73 as functional circuits. On the other hand, in the case of mounting the conventional electric fuse, a gate electrode of one electric fuse element is connected to one control circuit 63, and this control circuit 63 is connected to a data processing circuit 64 (see FIG. 13).

Thus, according to the electric fuse element of the embodiment, by using the source and the drain as the output terminals, an information amount of 2 channels, i.e., a maximum of 2 bits, can be held by one element. In other words, the number of electric fuse elements necessary for holding the same information amount can be halved from that of the conventional case.

FIG. 11 is a circuit diagram showing an example of the control circuit, the data processing circuit of one channel of FIG. 10. During programming, a gate voltage of the electric fuse element 71 is set to VBP, VDD is applied to a gate of a driving transistor 81 in the control circuit 72, and a high-level Prog signal is applied to a gate of a driving transistor 82. During reading, first, a gate signal Prech of a driving transistor 83 in the data processing circuit 71 is set to a high level, and the drain region 4 of the electric fuse element 71 is precharged to VSS. At this time, a gate of the electric fuse 71 is also set to VSS. Subsequently, a gate voltage of the electric fuse 71 is set to VDD, VDD is applied to the gate of the driving transistor 81 in the control circuit 72, a Prog signal is set to a low level, and a voltage appearing in the drain region 4 of the electric fuse 71 is compared with a reference voltage Ref and amplified by a sense amplifier 84, and then stored in a flip-flop 85. Thus, a one-time PROM can be configured.

As described above, according to the electric fuse of the second embodiment, an information amount of a maximum of 4 values (1, 1), (1, 0), (0, 1), and (0, 0) can be stored by one element, where "1" indicates conduction, and "0" indicates nonconduction. Moreover, it is possible to configure a ternary (3-value) memory which uses three values of (0, 0), (1, 0), and (0, 1).

Furthermore, when the data processing circuit 74 is replaced by a spare decoder or a memory cell matrix, it can be applied to a redundancy circuit of a memory. The second embodiment has been described by taking the example of the PMOS. However, the electric fuse can include an NMOS.

THIRD EMBODIMENT

FIGS. 12A to 12C are connection and sectional views of an electric fuse according to a third embodiment. According to the third embodiment, the electric fuse is of an inversion type, and employs a 2-terminal configuration in which a source region 3 and a drain region 4 are connected to form one terminal, and a gate electrode 6 is an output terminal.

During programming, for example, VSS is applied to each of the source region 3, the drain region 4 and the gate electrode 6, and a program voltage VBP is applied to a substrate (well) 2. As shown in FIGS. 12A to 12C, if the electric fuse comprises a PMOSFET, and the VBP is a positive potential, a depletion layer spreads from the source region 3 and the drain region 4, and dielectric breakdown can be generated limitedly in a gate dielectric film 5 on a substantial center between the source and the drain.

During reading, the well 2, the source region 3, the drain region 4, and the gate electrode 6 are precharged to, e.g., VSS. Subsequently, the well 2, the source region 3, and the drain region 4 are set to, e.g., VDD, and a potential change of the output terminal gate electrode 6 is detected. The potential of the gate electrode 6 is changed to VDD if the gate dielectric film is short-circuited, and maintained at VSS if it is not short-circuited.

Thus, according to the electric fuse of the third embodiment, since the short-circuiting place of the gate dielectric film is limited to the substantial center between the source and the drain while the one-element and one-channel scheme is employed, it is possible to realize an electric fuse of a small characteristic variance. The third embodiment has been described by taking the example of the PMOS. However, the electric fuse can include an NMOS.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A programming method of a MOS electric fuse comprising:
    preparing, as a fuse element, a MOS transistor which comprises a first impurity region and a second impurity region, both of a second conductivity type, formed to face with each other on an upper surface of a well of a first conductivity type on a semiconductor substrate, a gate dielectric film formed on the upper surface of the well at least between the first impurity region and the second impurity region, and a gate electrode formed through the gate dielectric film on the upper surface of the well held between the first impurity region and the second impurity region;
    applying, as required, a first voltage to the gate electrode and a second voltage different from the first voltage to the first impurity region, at a first timing, thereby short-circuiting the gate dielectric film only between the gate electrode and the first impurity region; and
    applying, as required, a third voltage to the gate electrode and a fourth voltage different from the third voltage to the second impurity region at a second timing different from the first timing, thereby short-circuiting the gate dielectric film only between the gate electrode and the second impurity region.

2. The method according to claim 1, wherein each pair of the first voltage and the second voltage, and the third voltage and the fourth voltage, form no channels between the first impurity region and the second impurity region.

3. The method according to claim 1, wherein the first conductivity type is an n type, and the MOS transistor is a PMOS transistor.

4. The method according to claim 3, wherein each of the first voltage and the third voltage is a positive potential, and each of the second voltage and the fourth voltage is a ground potential.

5. The method according to claim 1, wherein the first conductivity type is a p type, and the MOS transistor is an NMOS transistor.

6. The method according to claim 5, wherein each of the first voltage and the third voltage is a ground potential, and each of the second voltage and the fourth voltage is a positive potential.

7. A programming method of a MOS electric fuse comprising:
    preparing, as a fuse element, a MOS transistor which comprises a first impurity region and a second impurity region, both of a second conductivity type, formed to face with each other on an upper surface of a well of a first conductivity type on a semiconductor substrate, a gate dielectric film formed on the upper surface of the well at least between the first impurity region and the second impurity region, and a gate electrode formed through the gate dielectric film on the upper surface of the well held between the first impurity region and the second impurity region; and
    applying, as required, a first voltage to the gate electrode, a second voltage different from the first voltage to the well, and connecting the first impurity region and the second impurity region to be reverse-biased with respect to the well, and substantially short-circuiting the gate dielectric film between the gate electrode and a surface of the well only at a substantial center portion of the gate dielectric film between the first impurity region and the second impurity region.

8. The method according to claim 7, wherein the semiconductor well is an n type, and the MOS transistor is a PMOS transistor.

9. The method according to claim 8, wherein the first voltage is a ground potential, and the second voltage is a positive potential.

10. The method according to claim 7, wherein the semiconductor well is a p type, and the MOS transistor is an NMOS transistor.

11. The method according to claim 10, wherein the first voltage is a positive potential, and the second voltage is a ground potential.

12. A programming method of a MOS electric fuse comprising:
    preparing, as a fuse element, a MOS transistor which comprises a first impurity region and a second impurity region, both of a second conductivity type, formed to face with each other on an upper surface of a well of a first conductivity type on a semiconductor substrate, a gate dielectric film formed on the upper surface of the well at least between the first impurity region and the second impurity region, and a gate electrode formed through the gate dielectric film on the upper surface of the well held between the first impurity region and the second impurity region, wherein, when a conduction and a non-conduction between the gate electrode and the first impurity region or the second impurity region is expressed as "1" and "0", a first state (0, 0) is established with respect to between the gate electrode and the first impurity region and between the gate electrode and second impurity region as an initial state; and establishing, as required, one of three states (1,0), (0,1) and (1,1) by one method selected from the group consisting of:

establishing a second state (1, 0) with respect to between the gate electrode and the first impurity region and between the gate electrode and the second impurity region, by applying a first voltage to the gate electrode and a second voltage different from the first voltage to the first impurity region and short-circuiting the gate dielectric film only between the gate electrode and the first impurity region;

establishing a third state (0, 1) with respect to between the gate electrode and the first impurity region and between the gate electrode and the second impurity region, by applying a third voltage to the gate electrode and a fourth voltage different from the third voltage to the second impurity region and short-circuiting the gate dielectric film only between the gate electrode and the second impurity region; and establishing a forth state (1, 1) with respect to between the gate electrode and the first impurity region and between the gate electrode and the second impurity region, by applying the first voltage to the gate electrode and the second voltage different from the first voltage to one of the first impurity region and the second impurity region, and thereafter applying the third voltage to the gate electrode and the fourth voltage different from the third voltage to the other of the first impurity region and the second impurity region, thereby short-circuiting the gate dielectric film between the gate electrode and the first impurity region and between the gate electrode and the second impurity region.

13. The method according to claim 12, wherein each pair of the first voltage and the second voltage, and the third voltage and the fourth voltage, form no channels between the first impurity region and the second impurity region.

14. The method according to claim 13, wherein the first conductivity type is an n type, and the MOS transistor is a PMOS transistor.

15. The method according to claim 14, wherein each of the first voltage and the third voltage is a positive potential, and each of the second voltage and the fourth voltage is a ground potential.

16. The method according to claim 12, wherein the first conductivity type is a p type, and the MOS transistor is an NMOS transistor.

17. The method according to claim 16, wherein each of the first voltage and the third voltage is a ground potential, and each of the second voltage and the fourth voltage is a positive potential.

* * * * *